(12) United States Patent
Li et al.

(10) Patent No.: US 9,973,185 B2
(45) Date of Patent: May 15, 2018

(54) CASCADE SWITCH DEVICE AND VOLTAGE PROTECTION METHOD

(71) Applicant: DELTA ELECTRONICS, INC., Taoyuan (TW)

(72) Inventors: Zeng Li, Taoyuan (TW); Chao-Feng Cai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 212 days.

(21) Appl. No.: 14/813,140

(22) Filed: Jul. 30, 2015

(65) Prior Publication Data

US 2016/0181788 A1   Jun. 23, 2016

(30) Foreign Application Priority Data

Dec. 17, 2014   (CN) .......................... 2014 1 0788774

(51) Int. Cl.
| | |
|---|---|
| *H02H 3/28* | (2006.01) |
| *H03K 17/687* | (2006.01) |
| *H03K 17/082* | (2006.01) |
| *H03K 17/567* | (2006.01) |

(52) U.S. Cl.
CPC ....... *H03K 17/0828* (2013.01); *H03K 17/567* (2013.01); *H03K 17/6871* (2013.01); *H03K 2017/6875* (2013.01)

(58) Field of Classification Search
CPC ........... H03K 17/0828; H03K 17/6871; H03K 17/567; H03K 2017/6875
See application file for complete search history.

(56) References Cited

U.S. PATENT DOCUMENTS

| | | |
|---|---|---|
| 2012/0262220 A1 | 10/2012 | Springett et al. |
| 2012/0292635 A1 | 11/2012 | Iketani et al. |

FOREIGN PATENT DOCUMENTS

| | | |
|---|---|---|
| CN | 103516338 A | 1/2014 |
| CN | 103701442 A | 4/2014 |
| JP | 2013-42270 A | 2/2013 |

*Primary Examiner* — Zeev V Kitov
(74) *Attorney, Agent, or Firm* — CKC & Partners Co., Ltd.

(57) ABSTRACT

A cascode switch device includes a cascode circuit, which includes a first switch and a second switch, and a protection circuit. The protection circuit is coupled between the first switch and the second switch. A first leakage current passing through the protection circuit is greater than or equal to a difference between a second leakage current and a third leakage current, and is smaller than an upper limit value of a leakage current of the cascode circuit. An upper limit value of a withstanding voltage is present between the first terminal and the control terminal of the first switch. When the first switch operates at the upper limit value of the withstanding voltage, the second leakage current is an upper limit value of a leakage current passing through the first switch, and the third leakage current is a lower limit value of a leakage current passing through the second switch.

18 Claims, 4 Drawing Sheets

CASCADE SWITCH DEVICE AND VOLTAGE PROTECTION METHOD

This application claims priority to China Application Serial Number, 201410788774.5, filed Dec. 17, 2014, which is herein incorporated by reference.

BACKGROUND

Technical Field

The present disclosure relates to a cascade switch device. More particularly, the present disclosure relates to a cascade switch device having a voltage protection.

Description of Related Art

Power transistor switching devices are widely utilized in various power adjustments. The performance of the power transistor switching devices directly affect the conversion efficiency of the power adjustments, and the reliability of the power transistor switching devices directly affect the operational stability of the power adjustments.

For example, normally on elements and normally off elements areh used in high voltage applications. However, when the normally on elements and the normally off elements are mismatched, a voltage at an internal node of the system may be too high, resulting in the normally on elements and/or normally off elements damaged.

Therefore, a heretofore-unaddressed need exists in this industry to protect the normally on elements and normally off elements in the high voltage applications.

SUMMARY

One aspect of the present disclosure is to provide a cascade switch device. The cascade switch device includes a cascade circuit and a protection circuit. The cascade circuit includes a first switch and a second switch, in which a first terminal of the second switch is coupled to a first terminal of the first switch, and a second terminal of the second switch is coupled to a control terminal of the first switch. The protection circuit is coupled between the control terminal of the first switch and the first terminal of the second switch, in which a first leakage current passing through the protection circuit is greater than or equal to a difference between a second leakage current and a third leakage current, and the first leakage current passing through the protection circuit is smaller than an upper limit value of a leakage current of the cascade circuit. An upper limit value of a withstanding voltage is present between the first terminal and the control terminal of the first switch. When the first switch operates at the upper limit value of the withstanding voltage, the second leakage current is an upper limit value of a leakage current passing through the first switch, and the third leakage current is a lower limit value of a leakage current passing through the second switch.

One aspect of the present disclosure is to provide a cascade switch device. The cascade switch device includes a first switch, a second switch, and a resistor. The first switch includes a first terminal and a control terminal. The second switch includes a first terminal and a second terminal, in which the first terminal of the second switch is coupled to the first terminal of the first switch, and the second terminal of the second switch is coupled to the control terminal of the first switch. The resistor includes a first terminal and a second terminal, in which the first terminal of the resistor is coupled to the control terminal of the first switch, and the second terminal of the resistor is coupled to the first terminal of the second switch.

One aspect of the present disclosure is to provide a cascode switch device. The cascode switch device includes a first switch, a second switch, and a zener diode. The first switch includes a first terminal and a control terminal. The second switch includes a first terminal and a second terminal, in which the first terminal of the second switch is coupled to the first terminal of the first switch, and the second terminal of the second switch is coupled to the control terminal of the first switch. The zener diode includes an anode and a cathode, in which the anode of the zener diode is coupled to the control terminal of the first switch, and the cathode of the zener is coupled to the first terminal of the second switch.

One aspect of the present disclosure is to provide a voltage protection method. The voltage protection method is adapted to a cascode circuit that includes a first switch and a second switch. A first terminal of the second switch is coupled to a first terminal of the first switch, and a control terminal of the first switch is coupled to a second terminal of the second switch. The voltage protection method includes the following operations: setting at least one parameter of a protection circuit according to a first leakage current, a second leakage current, and a third leakage current, in which the first leakage current is a leakage current passing through the protection circuit, the first leakage current is greater than or equal to a difference between the second leakage current and the third leakage current, and the first leakage is smaller than an upper limit value of a leakage current of the cascode circuit, in which an upper limit value of a withstanding voltage is present between the first terminal and the control terminal of the first switch, when the first switch operates at the upper limit value of the withstanding voltage, the second leakage current is an upper limit value of a leakage current passing through the first switch, and the third leakage current is a lower limit value of a leakage current passing through the second switch; and splitting the leakage current passing through the first switch by the protection circuit.

In summary, the cascade switch device and the voltage protection method thereof provided in the present disclosure may have a more stable reliability, and thus the operation safety in the high voltage applications may be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
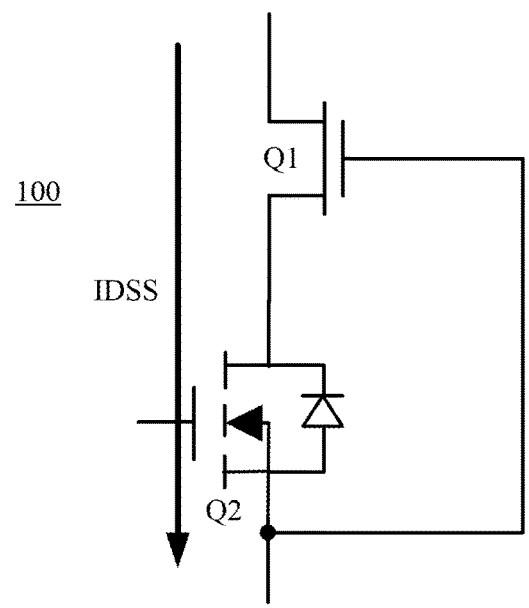
FIG. 1A is a schematic diagram of a cascode switch device according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another.

In this document, the term "coupled" may be termed as "electrically coupled", and the term "connected" may also be termed as "electrically connected". "Coupled" and "connected" may also be used to indicate that two or more elements cooperate or interact with each other.

Reference is now made to FIG. 1A. FIG. 1A is a schematic diagram of a cascode switch device according to one embodiment of the present disclosure. As shown in FIG. 1A, the cascode switch device 100 includes a switch Q1 and a switch Q2. A first terminal of the switch Q1 is coupled to a first terminal of the switch Q2, and a control terminal of the switch Q1 is coupled to a second terminal of the switch Q2. A second terminal of the switch Q1 and a control terminal and the second terminal of the switch Q2 can be connected to an external power source or an external circuit. In other words, through such arrangement, the cascode switch device 100 is effectively regarded as a switching element having three terminals.

In some embodiments, the switch Q1 is a normally on element. That is, a threshold voltage VTH1 between the control terminal and the first terminal of the switch Q1 is smaller than zero. In some other embodiments, the switch Q2 is a normally off element. That is, a threshold voltage VTH2 between the control terminal and the first terminal of the switch Q2 is greater than zero. For example, the switch Q1 includes a silicon-based field effect transistor, a SiC transistor, or an III-V compounds transistor (e.g., GaN), and switch Q2 includes a silicon-based field effect transistor, a SiC transistor, or an III-V compounds transistor. By choosing the corresponding elements for the switch Q1 and the switch Q2, the ability to withstand voltage of the cascode switch device 100 may be improved.

Figure 1B:
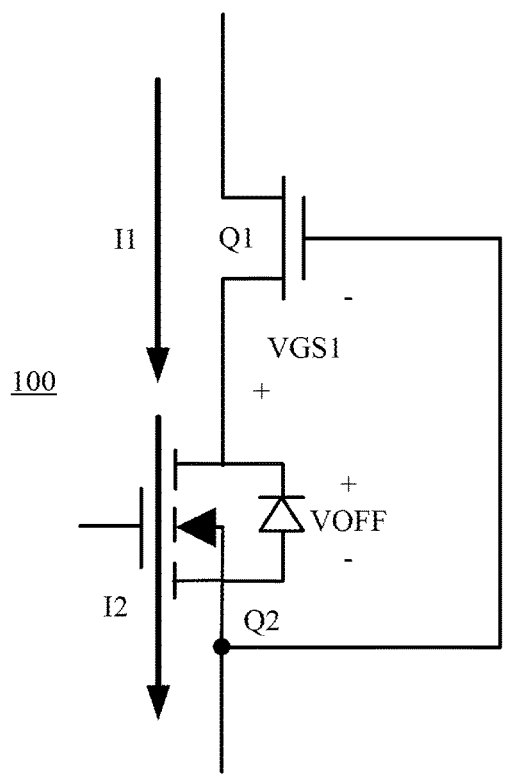
FIG. 1B is a schematic diagram illustrating when the cascode switch device shown in FIG. 1A is turned off according to one embodiment of the present disclosure.

Reference is now made to FIG. 1B. FIG. 1B is a schematic diagram illustrating when the cascode switch device shown in FIG. 1A is turned off according to one embodiment of the present disclosure.

As shown in FIG. 1A, when the cascode switch device 100 is turned off, a leakage current IDSS in the cascode switch device 100 averagely passes through the switch Q1 and the switch Q2. Under this circumstance, a voltage VOFF between the first terminal and the second terminal of the switch Q2 forms a negative bias voltage with respect to the control terminal of the switch Q1. Thus, the switch Q1 can be turned off to withstand a high voltage.

However, since the characteristics of the switch Q1 and the characteristics of the switch Q2 are mismatched (e.g., the threshold voltages are different), or the internal junction temperatures of the switches Q1 and Q2 are different, the leakage current of the switch Q1 and the leakage current of the switch Q2 are mismatched. Under this circumstance, the switch Q1 may be damaged, and thus the operations of the cascode switch device 100 may be failure.

For example, as shown in FIG. 1B, a leakage current I1 is the leakage current passing through the switch Q1 when the switch Q1 is turned off, and a leakage current I2 is the leakage current passing through the switch Q2 when the switch Q2 is turned off. If the leakage current I2 is smaller than the leakage current I1, an extra current (i.e., I1-I2) charges parasitic capacitances of the cascode switch device 100. Thus, the voltage VOFF and the voltage VGS1 between the control terminal and the first terminal of the switch Q1 get higher, and thus the leakage current I2 also gets higher. When the voltage VOFF and the voltage VGS1 exceed the voltage range able to be withstood by the switch Q2, the switch Q2 is damaged, and the control terminal of the switch Q1 may be directly damaged. As a result, the operations of the cascode switch device 100 may be failure.

Figure 2:
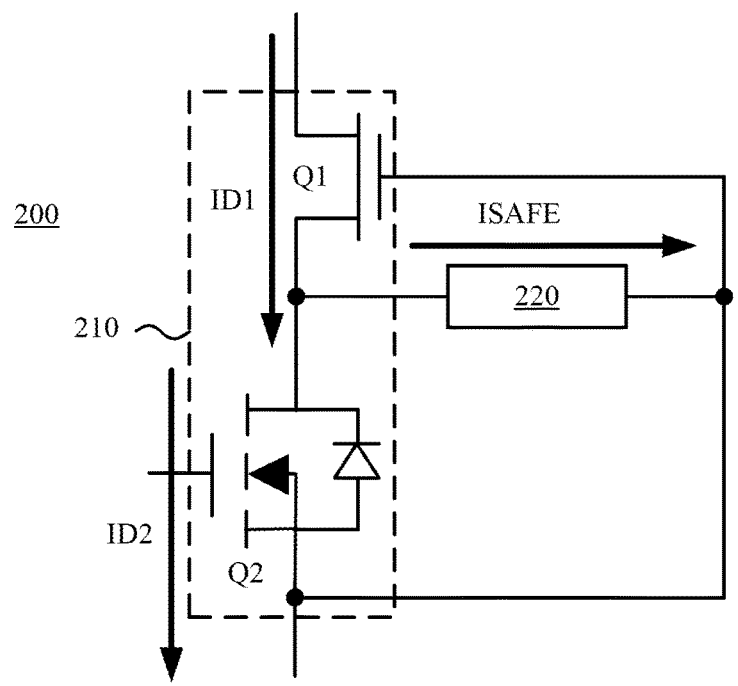
FIG. 2 is a schematic diagram of a cascode switch device according to one embodiment of the present disclosure.

Reference is now made to FIG. 2. FIG. 2 is a schematic diagram of a cascode switch device according to one embodiment of the present disclosure. As shown in FIG. 2, compared to the cascode switch device 100, the cascode switch device 200 in this embodiment further includes a protection circuit 220. For simplicity, in following paragraphs, the switch Q1 and the switch Q2 in the cascode switch device 200 are referred to as a cascode circuit 210. The protection circuit 220 is coupled to the control terminal of the switch Q1 and the first terminal of the switch Q2. The leakage current ISAFE passing through the protection circuit 220 is configured to be greater than or equal to a difference between a leakage current ID1 and a leakage current ID2 (i.e., ID1-ID2).

Moreover, in actual applications, when the leakage current (e.g., the leakage current IDSS in FIG. 1A) passing through the cascode circuit 210, unwanted power consumption is caused, and the switches Q1 and Q2 may be damaged. Therefore, the leakage current ISAFE passing through the protection circuit 220 is configured to be smaller than an upper limit value IDSS_MAX of the leakage current passing through the cascode circuit 210. In other words, the leakage current IDSS_MAX, the leakage current ISAFE, the leakage current ID1, and the leakage current ID2 satisfy the following equation (1):

$$IDSS\_MAX > ISAFE \geq ID1-ID2 \qquad (1)$$

It is noted that, in various embodiments, an upper limit value VMAX of a withstanding voltage is present between the first terminal and the control terminal of the switch Q1, in which the upper limit value VMAX are a absolute value of a maximum voltage that can be withstood by the first terminal and the control terminal of the switch Q1 under any possible operating conditions. When the switch Q1 operates at the upper limit value VMAX of the withstanding voltage, the leakage current ID1 is an upper limit value of a leakage current passing through the switch Q1, and the leakage current ID2 is a lower limit value of a leakage current passing through the switch Q2.

In greater detail, when the switch Q1 is a silicon-based transistor, a SiC transistor, or an III-V compounds transistor, the range of the leakage current I1 varies from about 1 nano-Ampere (nA) to about 100 micron Ampere (uA). Similarly, when the switch Q2 is a silicon-based transistor, a SiC transistor, or an III-V compounds transistor, the range of the leakage current I1 varies from about 1 nA to about 100 uA.

Further, in some embodiments, to keep the cascode circuit being correctly turned off, a lower limit value VMIN of a stable voltage of the protection circuit 220 is considered. If the lower limit value VMIN of the stable voltage of the protection circuit 220 is too low, the voltage VOFF is clamped to be lower than a absolute value of the threshold voltage VTH1 of the control terminal and the first terminal of the switch Q1. As a result, the operations of turning the cascode circuit 210 off is are affected. Therefore, the lower limit value VMIN of the stable voltage of the protection circuit 220 is required to satisfy the following equation (2):

$$\text{VMIN} > |\text{VTH1}| \qquad (2)$$

During the static DC operation, the current passing through the protection circuit 220 gets higher, the voltage between the two terminals, i.e., the control terminal of the switch Q1 and the first terminal of the switch Q2, of the protection circuit 220 also gets higher. In the words, the protection circuit 220 has a characteristic of a resistance. When a mismatch of leakage currents is present in the cascode circuit 210, the protection circuit 220 is able to provide an extra current path to split the leakage current, so as to balance the leakage current. As a result, the reliability of the cascode switch device 200 may be improved.

The following paragraphs provide various embodiments related to the protection circuit 220 to illustrate functions and applications thereof. The present disclosure is not limited to the following embodiments.

Figure 3:
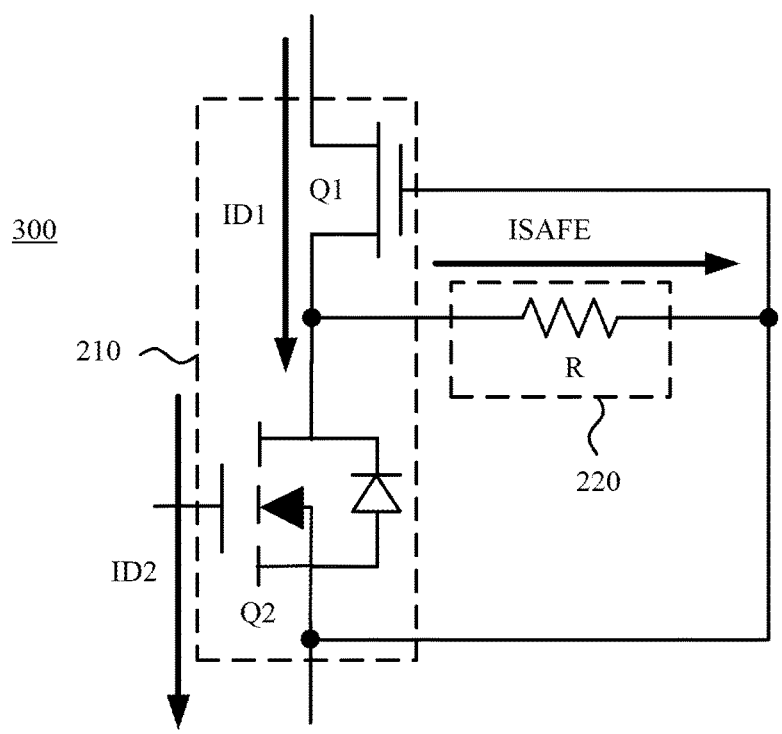
FIG. 3 is a schematic diagram of a cascode switch device according to one embodiment of the present disclosure.

Reference is now made to FIG. 3. FIG. 3 is a schematic diagram of a cascode switch device according to one embodiment of the present disclosure. In various embodiments, the protection circuit 220 has a linear resistance. For example, as shown in FIG. 3, the protection circuit 220 in the cascode switch device 300 is a resistor R. A first terminal of the resistor R is coupled to the control terminal of the switch Q1, and a second terminal of the resistor R is coupled to the second terminal of the switch Q2.

To satisfy the equation (1) above, the resistance value of the resistor R is determined according to the characteristics of the switches Q1 and Q2 and requirements of the leakage currents in a specification of the applied system. According to the equation (1), the resistor R is required to satisfy to the following equation (3). That is, the resistance value of the resistor R is greater than a ratio of the upper limit value VMAX of the withstanding voltage to the upper limit value IDSS_MAX of the leakage current of the cascode circuit 210, and is smaller than or equal to the upper limit value VMAX of the withstanding voltage to the difference between the leakage currents ID1 and ID2.

$$\text{VMAX}/\text{IDSS\_MAX} < R \leq \text{VMAX}/(\text{ID1}-\text{ID2}) \qquad (3)$$

For example, in some applications, the upper limit value IDSS_MAX of the leakage current of the cascode circuit 210 is 100 uA. According to measurement results and the specification, the switch Q1 is turned off when the voltage level at its control terminal is at −30 Volts (V), i.e., the upper limit value VMAX of the withstanding voltage is derived as: |−30|=30V. In addition, in actual applications , the internal junction temperature is about 23-175° C., and the highest voltage able to be withstood by the switch Q1 is about 600 V. When the switch Q1 is biased at −30V and withstands 600V, the upper limit value of the leakage current ID1 passing through the switch Q1 is measured to be 10 uA.

Similarly, in some actual applications, according to the characteristic of the switch Q2, the switch Q2 is able to operate at 23-150° C., and is able to withstand about 30V at maximum. When the cascode circuit 210 operates at 23° C. and withstands 30V, the lower limit value of the leakage current ID2 passing through the switch Q2 is measured to be 30 nA. Accordingly, by putting those values into the equation (3), the range of the resistance value of the resistor R can be obtained as: (30/100u)<R≤[30/(100u−30n)] =0.3*106<R≤3.009*106. Therefore, through such calculation, the resistance value of the resistor R should be 0.3 Million ohms (MΩ) to 3.009 MΩ.

In other words, in this example, the resistance value of the resistor R can be determined by considering a maximum difference in a mismatch of the leakage current ID1 and the leakage current ID2. As a result, the resistor R can correctly split the mismatch leakage current under various operating conditions, and thus the reliability of the cascode switch device 300 is improved.

It is understood that the element parameters and the operating conditions for the switch Q1 and the switch Q2 above are given for illustrative purposes only, and the present disclosure is not limited thereto. Those skilled in the art are able to adjust the range of the resistance value of the resistor R according to the example above, the actual element parameters, and requirements for the leakage currents in the system.

Figure 4:
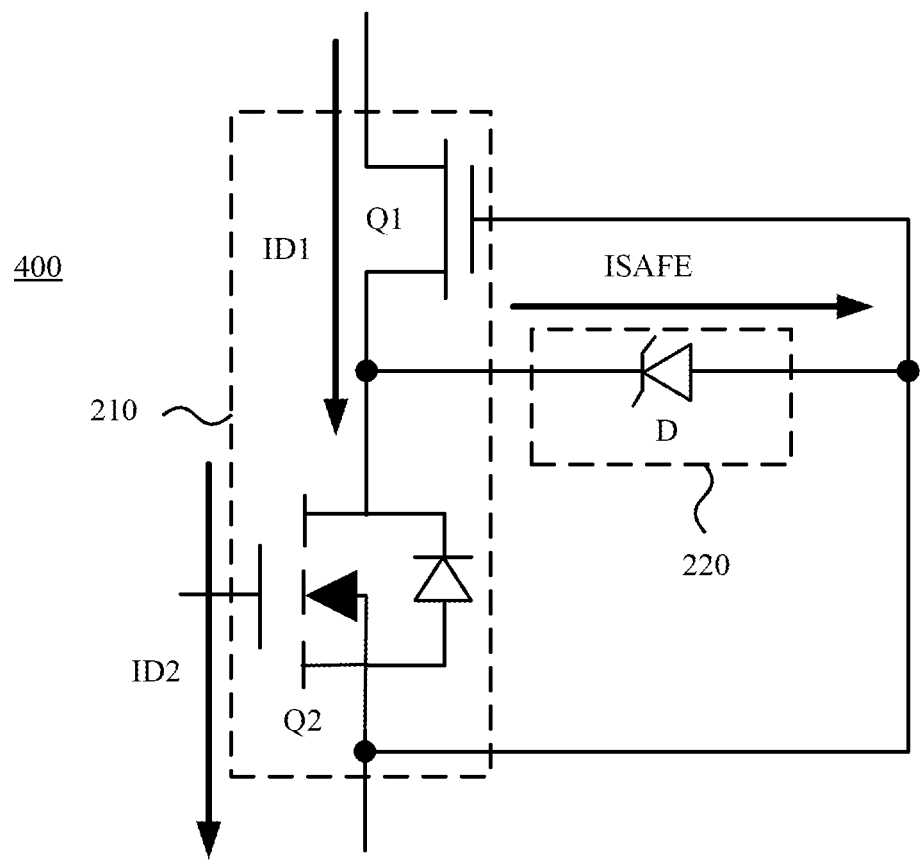
FIG. 4 is a schematic diagram of a cascode switch device according to one embodiment of the present disclosure.

Reference is now made to FIG. 4. FIG. 4 is a schematic diagram of a cascode switch device according to one embodiment of the present disclosure. In various embodiments, the protection circuit 220 has a non-linear resistance. For example, as shown in FIG. 4, the protection circuit 220 of the cascode switch device 400 is a zener diode D. An anode of the zener diode D is coupled to the control terminal of the switch Q1, and a cathode of the zener diode D is coupled to a first terminal of the switch Q1.

Similarly, in this embodiment, the characteristic of the zener diode D is required to satisfy the equation (1) above. For example, in some embodiments, the upper limit value IDSS_MAX of the leakage current, which is able to be withstood by the cascade circuit 210, is 100 uA, and the switch Q1 is turned off when the voltage level of its control terminal is at −30V (I.e., the upper limit value of the withstanding voltage is 30V). In actual applications, the internal junction temperature of the switch Q1 is about 23-175° C., and the highest voltage able to be withstood by the switch Q1 is about 600 V. When the switch Q1 is biased at −30V and withstands 600V, the upper limit value of the leakage current ID1 passing through the switch Q1 is measured to be 10 uA.

Similarly, in some applications, as mentioned above, according to the characteristics of the switches Q1 and Q2 and related operating conditions, when the switch Q1 is biased at −30V and withstands 600V, the upper limit value of the leakage current ID1 passing through the switch Q1 is measured to be 10uA. When the cascade circuit 210 operates at 23° C. and the switch Q2 withstands 30V, the lower limit value of the leakage current ID2 passing through the switch Q2 is measured to be 30nA. By putting those values into the equation (3), the characteristic of the zener diode D should satisfy: (100u)>ISAFE≥[(100u-30n)]=9.97u.

In the meantime, in this embodiment, to keep the cascade circuit being able to be turned off correctly, the equation (2) is required to be considered. In this example, the lower limit value VMIN of the stable voltage is the threshold voltage VZ of the zener diode D. In some applications, the switch Q1 operates at the highest junction temperature 175° C. and is biased at −30V, in which the threshold voltage VTH1 of the switch Q1 is −18-22V. Accordingly, according to the equation (2), the threshold voltage VZ of the zener diode D satisfy: VZ>|VTH1|=22V.

Therefore, in this embodiment, by setting the zener diode with the two conditions above, the cascade switch device 400 is able to be kept operating normally under various conditions. As a result, the reliability of the cascade switch device 400 may be improved.

It is understood that the parameters and the operating conditions of the switches Q1 and Q2, and the zener diode D are given for illustrative purpose only, and the present disclosure is not limited thereto. Those skilled in the are able to select the appropriate zener diode D according to the above calculations, actual element parameters, and requirements of leakage currents of specification of the system.

The protection circuit 220 having the linear resistance is illustrated with the resistor R in FIG. 3, and the protection circuit 220 having the non-linear resistance is illustrated with the zener diode D in FIG. 4. The present disclosure is not limited thereto. In various embodiments, the protection circuit 220 includes a resistor and a capacitor that are coupled in parallel with each other, a resistor and an inductor that are coupled in series with each other, a resistor and an element having a non-linear resistance (e.g., zener diode, transient voltage suppressor, etc) that are coupled in parallel or series with each other, or a combination thereof.

Figure 5:
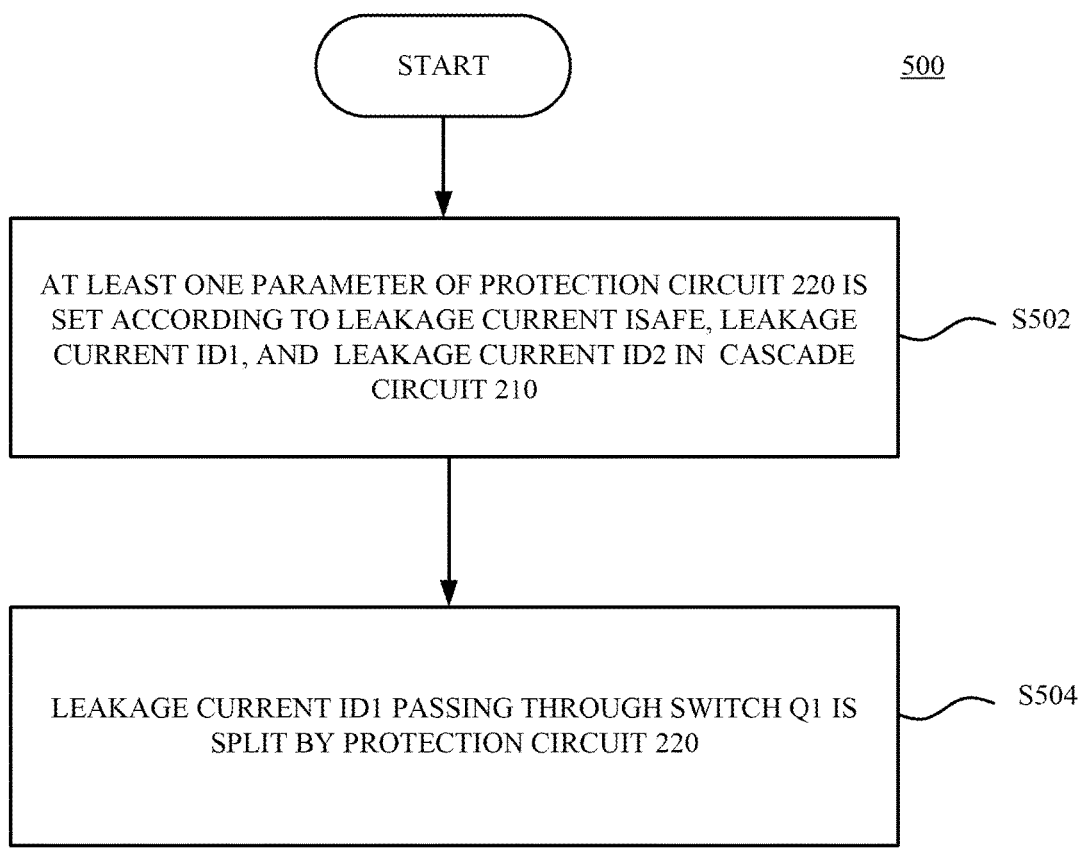
FIG. 5 is a flow chart of a voltage protection method according to one embodiment of the present disclosure.

Another aspect of the present disclosure is to provide a voltage protection method. Reference is now made to FIG. 5. FIG. 5 is a flow chart of a voltage protection method according to one embodiment of the present disclosure.

As shown in FIG. 5, the voltage protection method includes step S502 and step S504. In step S502, at least one parameter of the protection circuit 220 is set according to the leakage current ISAFE, the leakage current ID1, and the leakage current ID2 in the cascade circuit 210, in which when the switch Q1 operates at the upper limit value VMAX of the withstanding voltage, the leakage current ID1 is the upper limit value of the leakage current passing through the switch Q1, and the leakage current ID2 is the lower limit value of the leakage current passing through the switch Q2.

For example, as mentioned above, the resistance value of the resistor R in the cascode switch device 300 can be set according to the equation (1). Alternatively, the zener diode in the cascode switch device 400 can be set according to the equations (1) and (2). The arrangements are similar with the descriptions above, and thus the repetitious descriptions are not given here.

In step S504, the leakage current ID1 passing through the switch Q1 is split by the protection circuit 220.

For example, as shown in FIG. 3, when the leakage current ID1 and the leakage current ID2 are mismatched, the difference current between the leakage current ID1 and the leakage current ID2 can pass through the protection circuit 220. As a result, the voltage VOFF and the voltage VGS1 between the first terminal and the control terminal of the switch Q1 are kept from getting too high, and thus the reliability of the cascade switch device 300 may be increased.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A cascode switch device, comprising:
    a cascode circuit, comprising a first switch and a second switch, wherein a first terminal of the second switch is coupled to a first terminal of the first switch, and a second terminal of the second switch is coupled to a control terminal of the first switch; and
    a protection circuit coupled between the control terminal of the first switch and the first terminal of the second switch, wherein a withstanding current of the protection circuit is greater than or equal to a difference between an upper limit value of a second leakage current and a low limit value of a third leakage current, and the withstanding current of the protection circuit is smaller than an upper limit value of a leakage current of the cascode circuit;
    wherein when the first switch is in off state and the second transistor is in off state, an upper limit value of a withstanding voltage is present between the first terminal and the control terminal of the first switch, the first switch operates at the upper limit value of the withstanding voltage, the leakage current passing through the first switch is the upper limit value of the second leakage current, and the third leakage current passing through the second switch is the low limit value of the third leakage current.

2. The cascode switch device of claim 1, wherein when the current passing through the protection circuit gets higher, the voltage between the control terminal of the first switch and the first terminal of the second switch gets higher.

3. The cascode switch device of claim 1, wherein the third leakage current is the low limit value of the leakage current passing through the second switch when the cascode circuit operates at a lowest operating temperature.

4. The cascode switch device of claim 1, wherein the protection circuit comprises a resistor, a first terminal of the resistor being coupled to the control terminal of the first switch, and a second terminal of the resistor being coupled to the first terminal of the second switch, a resistance value of the resistor is greater than a ratio of the upper limit value of the withstanding voltage to the upper limit value of the leakage current of the cascode circuit, and is smaller than a ratio of the upper limit value of the withstanding voltage to the difference.

5. The cascode switch device of claim 1, wherein the protection circuit comprises a zener diode, an anode of the zener diode being coupled to the control terminal of the first switch, and a cathode of the zener diode being coupled to the first terminal of the first switch, a threshold voltage of the zener diode is greater than an absolute value of a threshold voltage between the first terminal and the control terminal of the first switch.

6. The cascode switch device of claim 1, wherein the protection circuit comprises a linear resistance or a non-linear resistance.

7. The cascode switch device of claim 1, wherein the protection circuit has a linear resistance or a non-linear resistance .

8. The cascode switch device of claim 1, wherein the first switch is a normally on element.

9. The cascode switch device of claim 1, wherein the second switch is a normally off element.

10. A cascode switch device, comprising:
    a first switch comprising a first terminal and a control terminal;
    a second switch comprising a first terminal and a second terminal, wherein the first terminal of the second switch is coupled to the first terminal of the first switch, and the second terminal of the second switch is coupled to the control terminal of the first switch; and
    a resistor comprising a first terminal and a second terminal, wherein the first terminal of the resistor is coupled to the control terminal of the first switch, and the second terminal of the resistor is coupled to the first terminal of the second switch, wherein a withstanding current of the resistor is greater than or equal to a difference between an upper limit value of a second leakage current and a low limit value of a third leakage current, and the withstanding current of the resistor is smaller than an upper limit value of a leakage current of the cascade switch device, wherein when the first switch is in an off state and the second transistor is in an off state, an upper limit value of a withstanding voltage is present between the first terminal and the control terminal of the first switch, when the first switch operates at the upper limit value of the withstanding voltage, the leakage current passing through the first switch is the upper limit value of the second leakage current, and the leakage current passing through the second switch is the low limit value of the third leakage current.

11. The cascode switch device of claim 10, wherein a resistance value of the resistor is greater than a ratio of the upper limit value of the withstanding voltage to the upper limit value of the leakage current of the cascode circuit, and is smaller than or equal to a ratio of the upper limit value of the withstanding voltage to the difference.

12. The cascode switch device of claim 10, wherein the first switch is a normally on element and the second switch is a normally off element.

13. A cascode switch device, comprising:

a first switch comprising a first terminal and a control terminal;

a second switch comprising a first terminal and a second terminal, wherein the first terminal of the second switch is coupled to the first terminal of the first switch, and the second terminal of the second switch is coupled to the control terminal of the first switch; and a zener diode comprising an anode and a cathode, wherein the anode of the zener diode is coupled to the control terminal of the first switch, and the cathode of the zener diode is coupled to the first terminal of the second switch, wherein a withstanding current of the zener diode is greater than or equal to a difference between an upper limit value of a second leakage current and a low limit value of a third leakage current, and the withstanding current of the zener diode is smaller than an upper limit value of a leakage current of the cascode switch device, wherein when the first switch is in off state and the second transistor is in off state, an upper limit value of a withstanding voltage is present between the first terminal and the control terminal of the first switch, when the first switch operates at the upper limit value of the withstanding voltage, the leakage current passing through the first switch is the upper limit value of the second leakage current, and the leakage current passing through the second switch is the low limit value of the third leakage current.

14. The cascode switch device of claim 13, wherein a threshold voltage of the zener diode is greater than an absolute value of a threshold voltage between the first terminal and the control terminal of the first switch.

15. The cascode switch device of claim 13, wherein the first switch is a normally on element and the second switch is a normally off element.

16. A voltage protection method adapted to protect a cascode circuit, the cascode circuit comprising a first switch and a second switch, a first terminal of the second switch being coupled to a first terminal of the first switch, a control terminal of the first switch being coupled to a second terminal of the second switch, and the voltage protection method comprising:

setting at a least one parameter of a protection circuit according to a withstanding current, a second leakage current, and a third leakage current;

wherein the withstanding current of the protection circuit is greater than or equal to a difference between an upper limit value of the second leakage current and a low limit value of the third leakage current, and the withstanding current of the protection circuit is smaller than an upper limit value of a leakage current of the cascade circuit;

wherein when the first switch is in an off state and the second transistor is in an off state, an upper limit value of a withstanding voltage is present between the first terminal and the control terminal of the first switch, when the first switch operates at the upper limit value of the withstanding voltage, the leakage current passing through the first switch is the upper limit value of the second leakage current, and the leakage current passing through the second switch is the low limit value of the third leakage current; and splitting the leakage current passing through the first switch by the protection circuit.

17. The voltage protection method of claim 16, wherein the protection circuit is a resistor, the at least one parameter is a resistance value of the resistor, and the step of setting the at least one parameter comprises:

setting the resistance value in a range that is greater than a ratio of the upper limit value of the withstanding voltage to the upper limit value of the leakage current of the cascode circuit, and is smaller than or equal to a ratio of the upper limit value of the withstanding voltage to the difference.

18. The voltage protection method of claim 16, wherein the protection circuit is a zener diode, the at least one parameter is a threshold voltage of the zener diode, and the step of setting the at least one parameter comprises:

setting the threshold voltage of the zener diode to be greater than an absolute value of a threshold voltage between the first terminal and the control terminal of the first switch.

\* \* \* \* \*